United States Patent
Qiu et al.

(10) Patent No.: US 12,232,361 B2
(45) Date of Patent: Feb. 18, 2025

(54) DISPLAY SUBSTRATE HAVING SUB-PIXEL AREAS AND DISPLAY APPARATUS INCLUDING THE SAME

(71) Applicants: Chengdu BOE Optoelectronics Technology Co., Ltd., Sichuan (CN); BOE TECHNOLOGY GROUP CO., LTD., Beijing (CN)

(72) Inventors: Yuanyou Qiu, Beijing (CN); Xingliang Xiao, Beijing (CN); Yao Huang, Beijing (CN); Cong Liu, Beijing (CN); Binyan Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 17/637,897

(22) PCT Filed: Mar. 12, 2021

(86) PCT No.: PCT/CN2021/080353
§ 371 (c)(1),
(2) Date: Feb. 24, 2022

(87) PCT Pub. No.: WO2021/218437
PCT Pub. Date: Nov. 4, 2021

(65) Prior Publication Data
US 2022/0285470 A1    Sep. 8, 2022

(30) Foreign Application Priority Data
Apr. 28, 2020  (CN) .......................... 202010352241.8

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131
(Continued)

(56) References Cited

U.S. PATENT DOCUMENTS

2021/0066409 A1*  3/2021  Fan ....................... G06F 1/1637

FOREIGN PATENT DOCUMENTS

| CN | 106991969 A | 7/2017 |
|----|-------------|--------|
| CN | 110047901 A | 7/2019 |

(Continued)

OTHER PUBLICATIONS

China Patent Office, CN202010352241.8 First Office Action issued on Jul. 6, 2021.

*Primary Examiner* — Quoc D Hoang
(74) *Attorney, Agent, or Firm* — HOUTTEMAN LAW LLC (57) ABSTRACT

A display substrate includes a base (10) having installation area (Q3), transition area (Q2), and display area (Q1). Sub-pixel areas in the transition area (Q2) include at least first type sub-pixel areas (P) and second type sub-pixel areas (D); sub-pixel areas in the installation area (Q3) include at least third type sub-pixel areas (A); first type sub-pixel areas (P) include pixel circuits; the pixel circuits include driving sub-circuits (20) and light-emitting devices (OLED); second type sub-pixel areas (D) include driving sub-circuits (20); third type sub-pixel areas (A) include OLED; OLED in the third type sub-pixel areas (A) of the installation area (Q3) are coupled to driving sub-circuits (20) in second type sub-pixel areas (D) of transition area (Q2) via signal con- (Continued)

nection lines (1); and orthographic projections of at least some signal connection lines (1) overlap on base (10).

18 Claims, 4 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 110265455 A | 9/2019 |
| CN | 110278300 A | 9/2019 |
| CN | 110289299 A | 9/2019 |
| CN | 111446282 A | 7/2020 |
| WO | WO 2019199139 A1 | 10/2019 |

\* cited by examiner

DISPLAY SUBSTRATE HAVING SUB-PIXEL AREAS AND DISPLAY APPARATUS INCLUDING THE SAME

CROSS-REFERENCE TO RELATED APPLICATIONS

This is a National Phase Application filed under 35 U.S.C. 371 as a national stage of PCT/CN2021/080353, filed on Mar. 12, 2021, an application claiming priority from Chinese patent application No. 202010352241.8 filed on Apr. 28, 2020, the disclosure of which is incorporated herein by reference.

TECHNICAL FIELD

The present disclosure belongs to the technical field of display substrates, and specifically relates to a display substrate and a display apparatus.

BACKGROUND

At present, in order to improve the light transmittance of the area where an under-display camera is located and ensure the photographing effect of the under-display camera, only a light-emitting device is reserved in the installation area of the camera, while signals for controlling light emission of the light-emitting devices are led out by pixel circuits in the same horizontal row, and wirings for the signals are made of a transparent conductive material. However, this method has great limitations in that when the camera has a large size or a plurality of cameras are provided, the number of transparent wires is limited by a longitudinal dimension of the pixels, resulting in a limited number of controlled light-emitting devices.

SUMMARY

To solve at least one of the problems in the existing art, the present disclosure provides a display substrate and a display apparatus.

In a first aspect, an embodiment of the present disclosure provides a display substrate, including a base having an installation area, a transition area surrounding the installation area, and a display area surrounding the transition area; the installation area, the transition area, and the display area each including a sub-pixel area; wherein the sub-pixel area in the transition area includes at least a first type sub-pixel area and a second type sub-pixel area; and the sub-pixel area in the installation area includes at least a third type sub-pixel area;

the first type sub-pixel area is provided with a pixel circuit on the base; the pixel circuit including a driving sub-circuit and a light-emitting device; the second type sub-pixel area is provided with the driving sub-circuit on the base; and the third type sub-pixel area is provided with the light-emitting device on the base; and wherein the light-emitting device in the third type sub-pixel area of the installation area is coupled to the driving sub-circuit in the second type sub-pixel area of the transition area via a signal connection line; different light-emitting devices are coupled to different signal connection lines and different driving sub-circuits; and orthographic projections of at least some of the signal connection lines overlap on the base.

The signal connection line includes a first sub-connection line and a second sub-connection line electrically coupled to each other; the first sub-connection line is in the transition area, the second sub-connection line is in the installation area, and at least some first sub-connection lines are located on different layers, and have orthographic projections overlapped on the base.

The first sub-connection line of each signal connection line is coupled to the second sub-connection line of the same signal connection line through a via penetrating an interlayer insulation layer.

The driving sub-circuit includes at least a thin film transistor; one part of the first sub-connection line is arranged on the same layer and made of the same material as a source electrode and a drain electrode of the thin film transistor, and the other part of the first sub-connection line is arranged on the same layer and made of the same material as the gate electrode of the thin film transistor.

The second sub-connection line is arranged on a same layer and made of a same material.

The sub-pixel area in the transition area further includes a fourth type sub-pixel area; and the fourth type sub-pixel area is a vacant pixel area;

the sub-pixel areas are arranged in an array, and multiple rows of sub-pixel areas in the transition area include a first pixel row and a second pixel row; the first pixel row is a row of sub-pixel areas having the driving sub-circuits coupled to the light-emitting devices in the installation area; and the second pixel row is a row of sub-pixel areas having at least the fourth type sub-pixel area without the first or second type sub-pixel area; and every N adjacent rows of light-emitting devices in the installation area form a group, where N≥2; and the driving sub-circuits coupled to the light-emitting devices of a same group are located in a same first pixel row; and any two adjacent first pixel rows are spaced apart by N−1 second pixel rows.

N=2, three second type sub-pixel areas are between two adjacent first type sub-pixel areas of the first pixel row, and two of the driving sub-circuits in the three second type sub-pixel areas are respectively coupled to two light-emitting devices in different rows in the installation area.

The sub-pixel area in the transition area further includes a fourth type sub-pixel area; and the fourth type sub-pixel area is a vacant pixel area;

the sub-pixel areas are arranged in an array, and multiple rows of sub-pixel areas in the transition area include a first pixel row and a second pixel row; the first pixel row is a row of sub-pixel areas having the driving sub-circuits coupled to the light-emitting devices in the installation area; and the second pixel row is a row of sub-pixel areas having at least the fourth type sub-pixel area without the first or second type sub-pixel area; and every M adjacent rows of light-emitting devices in the installation area form a group, where M≥4; and the driving sub-circuits coupled to the light-emitting devices of a same group are located in two first pixel rows; and two first pixel rows for coupling the light-emitting devices of the same group in the installation area are spaced apart by M−1 second pixel rows.

M=4, and the driving sub-circuits in the second type sub-pixel areas of the first pixel row are coupled to two rows of light-emitting devices in the installation area; and the light-emitting devices coupled to the driving sub-circuits in the second type sub-pixel areas of different first pixel rows are located in different rows; and three second type sub-pixel areas are between two adjacent first type sub-pixel areas of the first pixel row, and two of the driving sub-circuits in the three second type sub-pixel areas are respectively coupled to two light-emitting devices in different rows in the installation area.

The signal connection line extends to the installation area through the second pixel row in the transition area.

The second pixel row further includes the third type sub-pixel area; and the light-emitting device in the third type sub-pixel area of the second pixel row is coupled to the driving sub-circuit in the second type sub-pixel area in the transition area, and each driving sub-circuit is coupled to one light-emitting device, and different driving sub-circuits are coupled to different light-emitting devices.

The light-emitting device in the third type sub-pixel area of the second pixel row and the driving sub-circuit coupled thereto are located in the same column of sub-pixel areas, and the two sub-pixel areas are adjacently disposed.

The display substrate further includes a plurality of gate lines on the base, the driving sub-circuits coupled to the light-emitting devices of a same row are coupled to a same gate line.

The gate line coupled to the driving sub-circuits coupled to the light-emitting devices in the installation area penetrates the transition area and surrounds a peripheral area of the installation area, and a spacing of the gate lines in the transition area is greater than a spacing of the gate lines in the peripheral area of the installation area.

The transition area further includes fifth type sub-pixel areas in which compensation capacitors are provided, and the gate lines coupled to the driving sub-circuits coupled to the light-emitting devices in the installation area are coupled to the compensation capacitors in one-to-one correspondence.

The gate lines coupled to the driving sub-circuits in a row of the pixel areas including the fifth type sub-pixel areas are coupled to the compensation capacitors, and different gate lines are coupled to different compensation capacitors.

The display substrate further includes a first power line on the base and coupled to the driving sub-circuit; and a first electrode plate of the compensation capacitor is arranged on the same layer and made of the same material as the gate line, and a second electrode plate of the compensation capacitor is arranged on the same layer and made of the same material as the first power line.

The light-emitting devices in the transition area and in the installation area are arranged in a same manner.

In a second aspect, an embodiment of the present disclosure provides a display apparatus including the display substrate as described above.

DETAIL DESCRIPTION OF EMBODIMENTS

To improve understanding of the technical solution of the present disclosure for those skilled in the art, the present disclosure will now be described in detail with the help of accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components. Also, the use of the terms "a", "an", or "the" and similar referents do not denote a limitation of quantity, but rather denote the presence of at least one. The word "includes" or "comprises" or the like means that the element or item preceding the word includes elements or items that appear after the word or equivalents thereof, but does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

Figure 1:
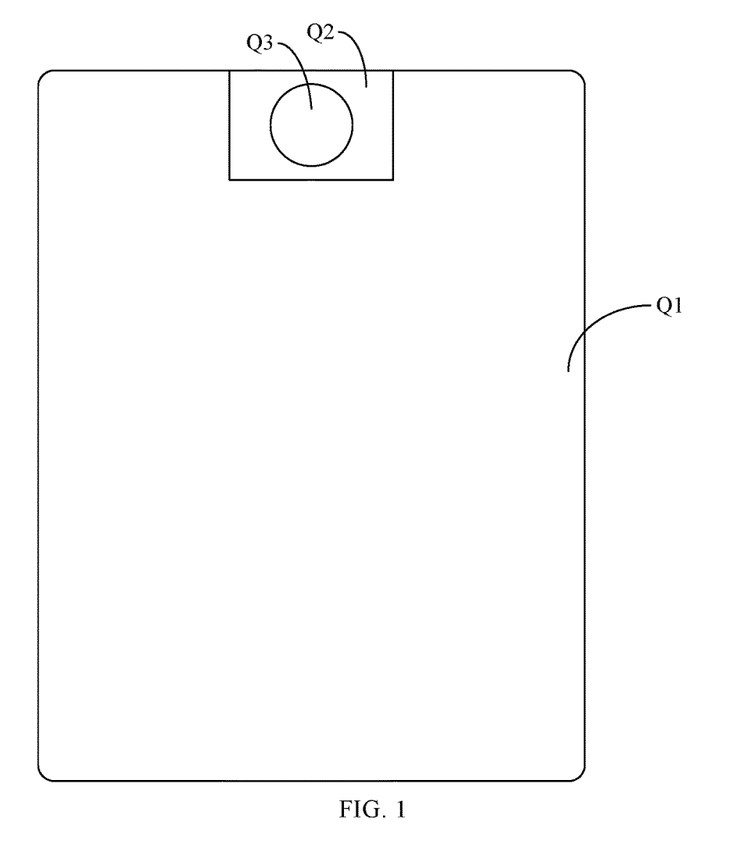
FIG. 1 is a schematic structural diagram of a display substrate.

FIG. 1 is a schematic structural diagram of a display substrate. The display substrate includes a base 10, which is divided into a display area Q1, a transition area Q2 and an installation area Q3. The transition area Q2 surrounds the installation area Q3, and the display area Q1 surrounds the transition area Q2. The display area Q1, the transition area Q2 and the installation area Q3 each include sub-pixel areas arranged in an array. For convenience of description, in the example of FIG. 1, the sub-pixel areas in the display area Q1, the transition area Q2 and the installation area Q3 have the same size and are arranged in the same manner, that is, the sub-pixel areas on the base 10 are arranged in an array. The sub-pixel areas are classified into various types, i.e., first type sub-pixel areas P, second type sub-pixel areas D, third type sub-pixel areas A, and fourth type sub-pixel areas K. The first type sub-pixel areas P are configured to provide pixel circuits including driving sub-circuits 20 and light-emitting devices OLED; the second type sub-pixel areas D are configured to provide the driving sub-circuits 20; the third type sub-pixel areas A are configured to provide the light-emitting devices OLED; and the fourth type sub-pixel areas K are vacant pixel areas. That is, no pixel element (e.g., a thin film transistor, a light-emitting device OLED, etc.) is provided in the fourth type sub-pixel areas K.

Figure 2:
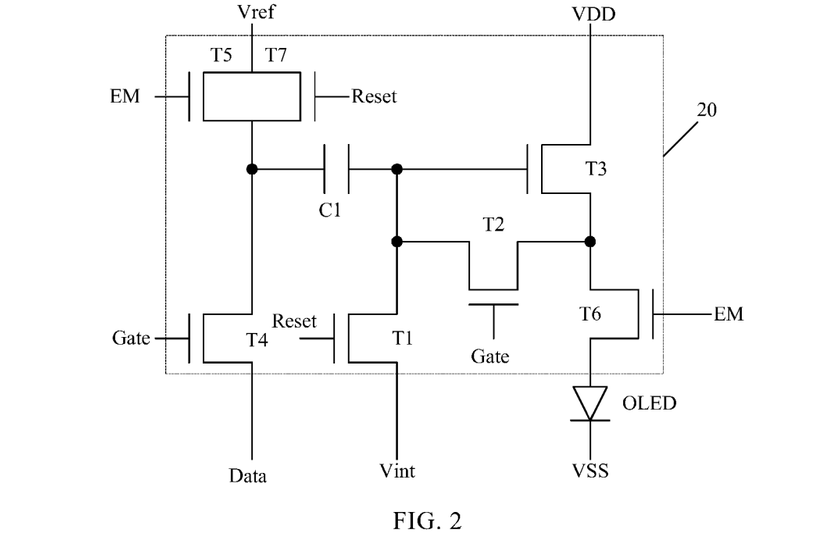
FIG. 2 is a schematic structural diagram of a pixel circuit.

Specifically, the driving sub-circuit 20 in the pixel circuit includes at least a switch transistor and a driving transistor, and may of course further include a threshold compensation transistor, a storage capacitor, or other structures, as shown in FIG. 2, which gives an exemplary pixel circuit. The pixel circuit includes a driving sub-circuit 20 and a light-emitting device OLED. The driving sub-circuit 20 specifically includes: a first reset transistor T1, a threshold compensation transistor T2, a driving transistor T3, a switch transistor T4, a first light-emitting control transistor T5, a second light-emitting control transistor T6, a second reset transistor T7, and a first storage capacitor C1. A first electrode of the first reset transistor T1 is coupled to an initial voltage signal terminal Vint, a second electrode of the first reset transistor T1 is coupled to a second end of the first storage capacitor C1, a first electrode of the threshold compensation transistor T2, and a control electrode of the driving transistor T3, and a control electrode of the first reset transistor T1 is coupled to a reset signal terminal Reset. A second electrode of the threshold compensation transistor T2 is coupled to a second electrode of the driving transistor T3 and a first electrode of the second light-emitting control transistor T6, and a control electrode of the threshold compensation transistor T2 is coupled to a gate line Gate. A first electrode of the driving transistor T3 is coupled to a first power line VDD. A first electrode of the switch transistor T4 is coupled to a data line Data, a second electrode of the switch transistor T4 is coupled to a second electrode of the first light-emitting control transistor T5, a second electrode of the second reset transistor T7, and a first electrode of the first storage capacitor C1, and a control electrode of the switch transistor T4 is coupled to the gate line Gate. A first electrode of the first light-emitting control transistor T5 is coupled to a reference voltage signal terminal Vref, and a control electrode of the first light-emitting control transistor T5 is coupled to a light-emitting control line EM. A second electrode of the second light-emitting control transistor T6 is coupled to a first electrode of the light-emitting device OLED, and a control electrode of the second light-emitting control transistor T6 is coupled to the light-emitting control line EM. A first electrode of the second reset transistor T7 is coupled to the reference voltage signal terminal Vref, a control electrode of the second reset transistor T7 is coupled to the reset signal terminal Reset, and a second electrode of the light-emitting device OLED is coupled to a second power line VSS.

It should be noted here that the driving sub-circuit 20 being coupled to the gate line Gate means that the control electrode of the switch transistor in the driving sub-circuit 20 is coupled to the gate line Gate; the driving sub-circuit 20 being coupled to the data line Data means that the first electrode of the switch transistor is coupled to the data line Data; and the driving sub-circuit 20 being coupled to the light-emitting device OLED means that the second electrode of the driving transistor of the driving sub-circuit 20 is coupled to the first electrode of the light-emitting device OLED.

The above transistors may be thin film transistors or field effect transistors or other devices with the same characteristics, and since source electrode and drain electrode of the transistor adopted are symmetrical, there is no difference between the source electrode and the drain electrode. In an embodiment of the present disclosure, for distinguishing purposes, the source electrode of the transistor is referred to as the first electrode, the drain electrode is referred to as the second electrode, and the gate electrode is referred to as the control electrode. In addition, the transistors may be classified into N-type transistors and P-type transistors according to the characteristics of the transistors. When a P-type transistor is adopted, the first electrode is referred to as the source electrode of the P-type transistor, the second electrode is referred to as the drain electrode of the P-type transistor, and when a low level is input into the gate electrode, the source electrode and the drain electrode are in on state. When an N-type transistor is adopted, the first electrode is referred to as the source electrode of the N-type transistor, the second electrode is referred to as the drain electrode of the N-type transistor, and when a high level is input into the gate electrode, the source electrode and the drain electrode are in on state. The above transistors in the pixel circuit are all illustrated as N-type transistors, and it is conceivable that the implementation with P-type transistors is easily conceivable by those skilled in the art without creative efforts, and therefore, also falls within the scope of the embodiments of the present disclosure.

The display substrate shown in FIG. 1 is particularly suitable for a display panel with an under-display camera. The installation area Q3 corresponds to the area where a camera element is installed, and the display area Q1 is configured to display pictures. Since the transition area Q2 and the installation area Q3 do not need to display pictures, the pixel resolutions of the two areas may be lower than that of the display area Q1. Meanwhile, since the camera is installed under the display, in order to prevent pixel elements (such as thin film transistors, light-emitting devices (OLED), or the like) in the installation area Q3 from shielding the camera, only transparent light-emitting devices (OLED) are provided in the installation area Q3. It should be understood that the light-emitting devices OLED in the installation area Q3 all refer to transparent light-emitting devices OLED in the following description.

Figure 3:
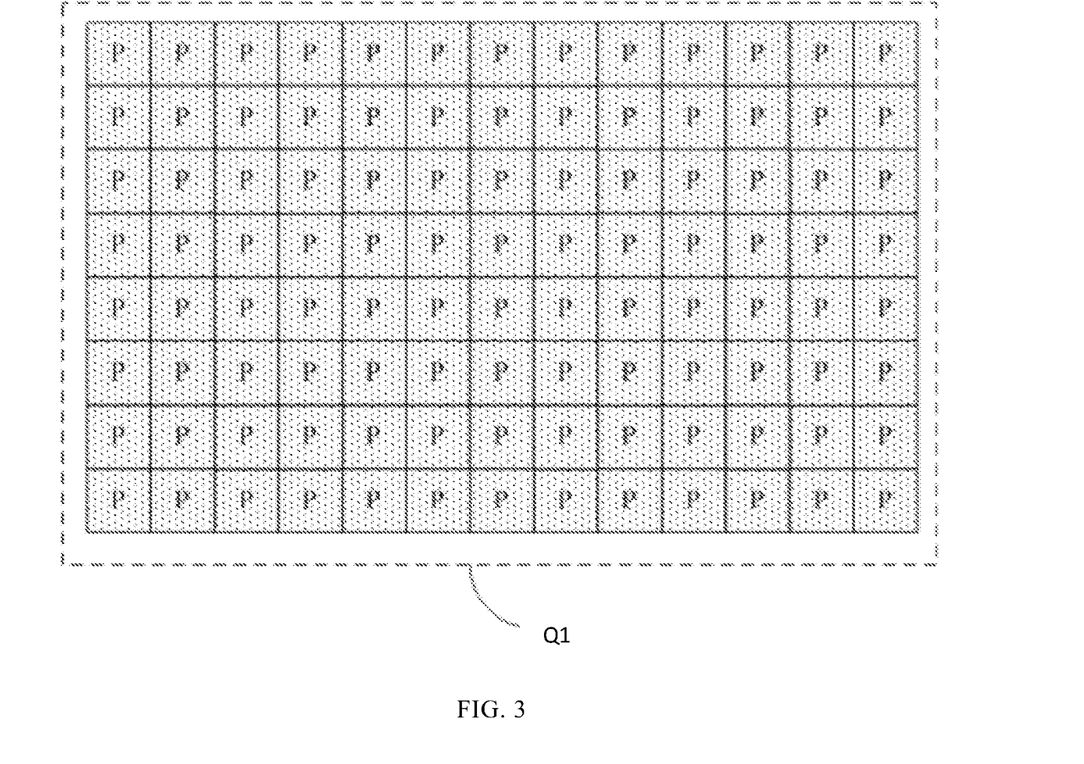
FIG. 3 is a schematic diagram showing arrangement of pixels in a display area of a display substrate.

FIG. 3 gives a schematic diagram showing arrangement of pixels in a display area Q1 of a display substrate. As shown in FIG. 3, the sub-pixel areas in the display area Q1 include only first type sub-pixel areas P. That is, each sub-pixel area of the display area Q1 is provided with pixel circuits. For the pixel circuits in the respective sub-pixel areas of the display area Q1, the pixel circuits in the same row are controlled by the same gate line Gate, and the pixel circuits in the same column receive data input via the same data line Data.

Figure 4:
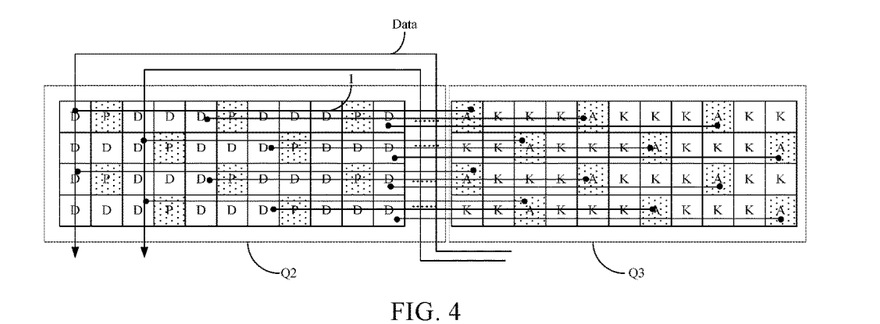
FIG. 4 is a schematic diagram showing arrangement of pixels in a transition area and an installation area of a display substrate.

FIG. 4 is a schematic diagram showing arrangement of pixels in a transition area Q2 and an installation area Q3 of a display substrate. As shown in FIG. 4, the sub-pixel areas in the transition area Q2 include first type sub-pixel areas P and second type sub-pixel areas D. That is, some of the sub-pixel areas are provided with pixel circuits, and the other sub-pixel areas are provided with only driving sub-circuits 20. The sub-pixel areas in the installation area Q3 include third type sub-pixel areas A and fourth type sub-pixel areas K. That is, some of the sub-pixel areas are provided with light-emitting devices OLED, and the remaining sub-pixels are vacant pixel areas without any pixel element. The third type sub-pixel areas A in the installation area Q3 are provided with light-emitting devices OLED, which are driven by the driving sub-circuits 20 in the second type sub-pixel areas D of the transition area Q2. Specifically, the light-emitting devices OLED, located in the third type sub-pixel areas A of the installation area Q3, are coupled to the driving sub-circuits 20 in the second type sub-pixel areas D of the transition area Q2 via signal connection lines 1. Data signals provided into the respective light-emitting devices OLED located in the installation area Q3 are transferred from the driving sub-circuits 20 in the corresponding second type sub-pixel areas D of the transition area Q2 via data lines Data arranged between the installation area Q3 and the transition area Q2. In order to facilitate the driving of the light-emitting devices OLED, the light-emitting devices OLED in the third type sub-pixel areas A of the installation area Q3 are coupled to the driving sub-circuits 20 located in the same row in the corresponding second type sub-pixel areas D of the transition area Q2 through the signal connection line. It should be understood that each light-emitting device OLED is coupled to one driving sub-circuit 20 via the corresponding signal connection line 1, and different light-emitting devices OLED are coupled to different driving sub-circuits 20.

The inventor has found that, since the each light-emitting device OLED in the installation areas Q3 need to be coupled to the driving sub-circuit 20 in the same row in the second type sub-pixel areas D of the transition area Q2 via the signal connection line 1, when the camera has a large size or a plurality of cameras are provided, but an area of the transition area Q2 is fixed, the number of signal connection lines 1 that can be arranged in the transition area will be limited, resulting in a limited number of the light-emitting devices OLED and a reduced area of the installation area Q3, and further limiting the installation of a large-sized camera or the number of a plurality of cameras.

In view of the above problems, embodiments of the present disclosure provide the following solutions.

In a first aspect, as shown in FIGS. 1, 4, and 5 to 8, an embodiment of the present disclosure provides a display substrate, including a base 10, which is divided into a display area Q1, a transition area Q2 and an installation area Q3. The transition area Q2 surrounds the installation area Q3, and the display area Q1 surrounds the transition area Q2. The display area Q1, the transition area Q2 and the installation area Q3 each include sub-pixel areas arranged in an array. The sub-pixel areas located in the transition area Q2 include at least first type sub-pixel areas P and second type sub-pixel areas D. The sub-pixel areas in the installation area Q3 include at least third type sub-pixel areas A. The first type sub-pixel areas P are provided with pixel circuits located on the base 10. The pixel circuits each include a driving sub-circuit 20 and a light-emitting device OLED. The second type sub-pixel areas D are provided with the driving sub-circuits 20 located on the base 10. The third type sub-pixel areas A are provided with the light-emitting devices OLED located on the base 10. The light-emitting devices OLED in the third type sub-pixel areas A of the installation area Q3 are coupled to the driving sub-circuits 20 in the second type sub-pixel areas D of the transition area Q2 via signal connection lines 1; different light-emitting devices OLED are coupled to different signal connection lines 1 and different driving sub-circuits 20; and orthographic projections of at least some of the signal connection lines 1 overlap on the base 10.

It should be noted here that the signal connection lines 1 are disposed in one-to-one correspondence with the light-emitting devices OLED in the installation area Q3, that is, one signal connection line 1 provides a driving current for only one light-emitting device OLED. In this manner, the signal connection lines 1 cannot be short circuited, so it should be understood that, although the orthographic projections of at least some of the signal connection lines 1 on the base 10 overlap in the embodiment of the present disclosure, at least the overlapped portions of any two signal connection lines 1 having overlapped orthographic projections are disposed on different layers, and an interlayer insulation layer is disposed between the two layers to separate the two layers, so as to avoid any short circuit of the signal connection lines 1.

The display area Q1, the transition area Q2, and the installation area Q3 may each have a circular shape, a square shape, a polygonal shape or any other shape, and shapes of the three areas may be the same or different, which are not limited in the embodiment of the present disclosure. A camera, or further a sensor, a HOME key, a handset, a speaker or other devices, may be installed in the installation area Q3, which is not limited in the embodiment of the present disclosure, and the following description will be given by taking a camera installed in the installation area Q3 as an example.

In the display substrate of the embodiment of the present disclosure, since at least some of the signal connection lines 1 for connecting the driving sub-circuits 20 in the transition area Q2 and the light-emitting devices OLED in the installation area Q3 have overlapped orthographic projections on the base 10, more signal connection lines 1 can be provided in the transition area Q2 with fixed space, thereby meeting the requirements on the area of the installation area Q3 for installing a large-sized camera or a plurality of cameras.

In some embodiments, in order for uniform display on the installation area Q3 and the transition area Q2, the light-emitting devices in the installation area Q3 and in the transition area Q2 are arranged in the same manner. That is, one light-emitting device OLED (which may be a light-emitting device OLED of a pixel circuit in the first type sub-pixel area P, or a light-emitting device OLED in the third type sub-pixel area A) is provided in the transition area Q2 every several sub-pixel areas, and likewise, one light-emitting device OLED is provided in the installation area Q3 every the same number of sub-pixel areas. The embodiments of the present disclosure are all illustrated by taking the example where the light-emitting devices in the installation area Q3 and in the transition area Q2 are arranged in the same manner.

Figure 5:
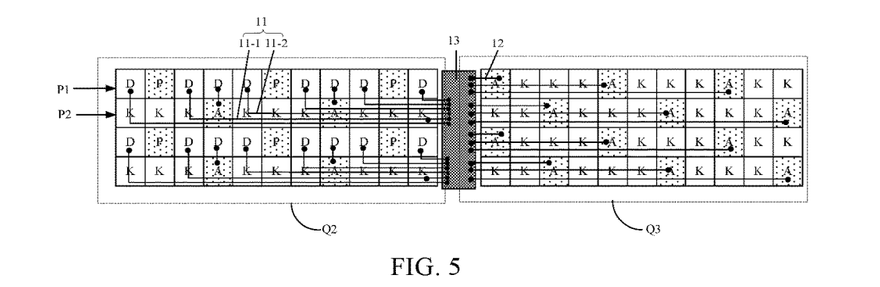
FIG. 5 is a schematic structural diagram of a transition area and an installation area of a display substrate according to an embodiment of the present disclosure.

In some embodiments, as shown in FIG. 5, each signal connection line 1 includes a first sub-connection line 11 disposed in the transition area Q2 and a second sub-connection line 12 disposed in the installation area Q3. Since a camera is to be provided in the installation area Q3, the installation area Q3 is at least provided with a transparent area for the camera, and therefore, the second sub-connection line 12 needs to be made of a transparent conductive material (e.g., indium tin oxide, ITO). In order to provide more signal connection lines 1 within the limited area of the transition area Q2 to provide driving currents for more light-emitting devices OLED in the installation area Q3, at least some of the first sub-connection lines 11 are disposed on different layers in the embodiment of the present disclosure, and the at least some of the first sub-connection lines 11 on different layers have overlapped orthographic projections on the base 10.

Apparently, the signal connection lines 1 in the embodiment of the present disclosure may be made of a transparent conductive material, and in this case, only some of the signal connection lines 1 are to be disposed on different layers, and orthographic projections of the signal connection lines 1 disposed on different layers overlap on the base 10 so that the wiring space in the transition area Q2 can be saved, while the transmittance of the installation area Q1 is not reduced.

In some embodiments, as shown in FIG. 5, when the first sub-connection line 11 and the second sub-connection line 12 of each signal connection line 1 are disposed on different layers, an interlayer insulation layer is disposed between the layer where the first sub-connection line 11 is located and the layer where the second sub-connection line 12 is located, and the first sub-connection line 11 and the second sub-connection line 12 of each signal connection line 1 may be coupled through a via penetrating the interlayer insulation layer. It should be noted that the position 13 in FIG. 5 represents the position where the first sub-connection line 11 and the second sub-connection line 12 are coupled through layers.

In some embodiments, the driving sub-circuit 20 includes thin film transistors, such as the 7 transistors as shown in FIG. 2. Specifically, taking the schematic diagram showing the connection between a driving transistor T3 and a light-emitting device OLED shown in FIG. 6 as an example, the driving transistor includes a semiconductor active layer 31 located on the base 10, a gate insulation layer 101 disposed on the semiconductor active layer 31, a gate electrode 32 disposed on the gate insulation layer 101, an interlayer insulation layer 102 disposed on the gate electrode 32, and a source electrode 33 and a drain electrode 34 disposed on the interlayer insulation layer 102. A planarization layer 103 is disposed on the layer where the source 33 and the drain 34 of the driving transistor T3 are located, and the light-emitting device OLED is disposed over the planarization layer 103.

Figure 6:
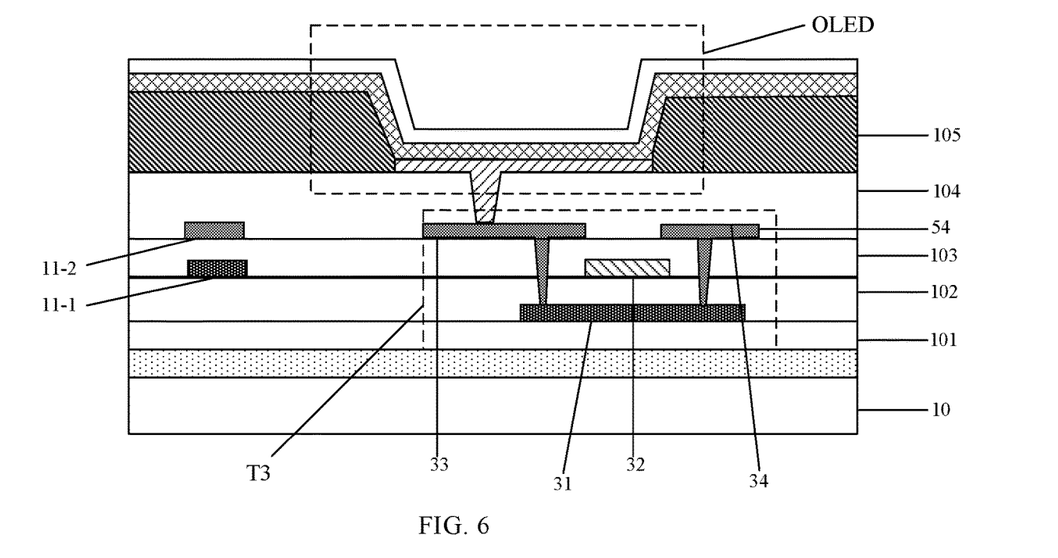
FIG. 6 is a cross-sectional view of a display substrate according to an embodiment of the present disclosure.

In an embodiment the present disclosure, as shown in FIG. 6, part of the first sub-connection lines 11 of the respective signal connection lines 1 may be arranged on the same layer and made of the same material as the source electrodes and the drain electrodes of the thin film transistors, and the others may be arranged on the same layer and made of the same material as the gate electrodes of the thin film transistors. With such arrangement, part of the first sub-connection lines 11-2 may be formed simultaneously as the source electrodes and the drain electrodes of the thin film transistors through a single patterning process, and the other first sub-connection lines 11-1 may be formed simultaneously as the gate electrodes of the thin film transistors through a single patterning process, so that even though the signal connection lines in the embodiments of the present disclosure are formed of a two-layer structure, the thickness of the display substrate, as well as the process cost, will not be increased. Meanwhile, since the source electrode, the drain electrode and the gate electrode of the thin film transistor are each made of a metal material, which has smaller resistance compared with ITO, the material of the source electrode, the drain electrode or the gate electrode is used as the material of the first sub-connection lines 11, thereby forming the signal connection lines 1 with reduced resistance, which is beneficial to transmission of the driving current.

It should be noted that, in the embodiment of the present disclosure, the illustration is made by taking the example where some of the first sub-connection lines 11 are arranged on the same layer as the source electrodes and the drain electrodes of the thin film transistors, and the others are arranged on the same layer as the gate electrodes of the thin film transistors. Apparently, one of the first sub-connection lines 11 may be formed by a first sub-structure arranged on the same layer as the source electrode and the drain electrode of one thin film transistor coupled with a second sub-structure arranged on the same layer as the gate electrode of the thin-film transistor. Alternatively, it is also possible that the first sub-connection lines 11 are not disposed on the same layer as the source electrodes, the drain electrodes and the gate electrodes of the thin film transistors, as long as it is ensured that the orthographic projections of some of the first sub-connection lines 11 overlap on the base 10.

In some embodiments, the transition area Q2 further includes fourth type sub-pixel areas K. That is, the transition area Q2 includes vacant pixel areas. A row of sub-pixel areas in the transition area Q2 having the driving sub-circuits 20 coupled to the light-emitting devices OLED in the installation area Q3 is referred to as a first pixel row P1; and a row of sub-pixel areas in the transition area Q2 having at least the fourth type sub-pixel areas K without first type sub-pixel areas P or second type sub-pixel areas D (i.e., no driving sub-circuit 20 is provided) is referred to as a second pixel row P2. At least one second pixel row P2 is provided between any two adjacent first pixel rows P1, and the signal connection lines 1 connect the driving sub-circuits 20 in the first pixel row P1 to the light-emitting devices OLED in the installation area Q3 via the second pixel row P2.

Since the second pixel row P2 is provided in the transition area Q2, and the second pixel row P2 is provided with the fourth type sub-pixel areas K without driving sub-circuit 20, certain wiring space is provided for the signal connection lines 1 so that more signal connection lines 1 can be disposed in the transition area Q2, and driving currents can be provided for more light-emitting devices OLED in the installation area Q3. Meanwhile, the area of the installation area Q3 can be correspondingly enlarged, which is beneficial for provision of a large-sized camera or a plurality of cameras.

In some embodiments, the second pixel row P2 is further provided with third type sub-pixel areas A, and the light-emitting devices OLED in the third type sub-pixel areas A are coupled to the driving sub-circuits 20 in the second type sub-pixel areas D of the first pixel row P1. Specifically, the driving sub-circuits 20 in the second type sub-pixel areas D of the first pixel row P1 to which the light-emitting devices OLED in the third type sub-pixel areas A of the second pixel row P2 are coupled are located at the same column and disposed in adjacent sub-pixel areas. With such arrangement, the light-emitting devices OLED in the third type sub-pixel areas A can be conveniently coupled to the driving sub-circuits 20 in the second type sub-pixel areas D of the first pixel row P1.

In some embodiments, the first pixel row P1 further includes first type sub-pixel areas P provided with pixel circuits. The light-emitting devices OLED in the pixel circuits of the first pixel row P1 and the light-emitting devices OLED in the same row in the installation area Q3 are arranged according to a certain rule. That is, the light-emitting devices OLED in each row of sub-pixel areas throughout the transition area Q2 and the installation area Q3 are arranged according to a preset rule. For example, in each row of sub-pixel areas, one light-emitting device OLED (which may be a light-emitting device OLED in a pixel circuit or a separate light-emitting device OLED) is disposed in sub-pixel areas at an interval of three sub-pixel areas. In order for uniform display on the transition area Q2 and the installation area Q3, the light-emitting devices OLED in any adjacent rows of sub-pixels are disposed alternately and spaced by one sub-pixel area in the row direction. Apparently, the above merely gives an exemplary arrangement of the light-emitting devices OLED, and the arrangement positions of the light-emitting devices OLED may be further adjusted according to the sizes of the installation area Q3 and the transition area Q2.

In some embodiments, the light-emitting devices OLED in the installation area Q3 are classified into multiple groups, each group including N rows of light-emitting devices OLED arranged adjacently, where N is an integer and N≥2. The driving sub-circuits 20 coupled to the light-emitting devices OLED of the same group in the installation area Q3 are located in the same first pixel row P1; and any two adjacent first pixel rows P1 are spaced apart by N−1 second pixel rows P2.

Figure 7:
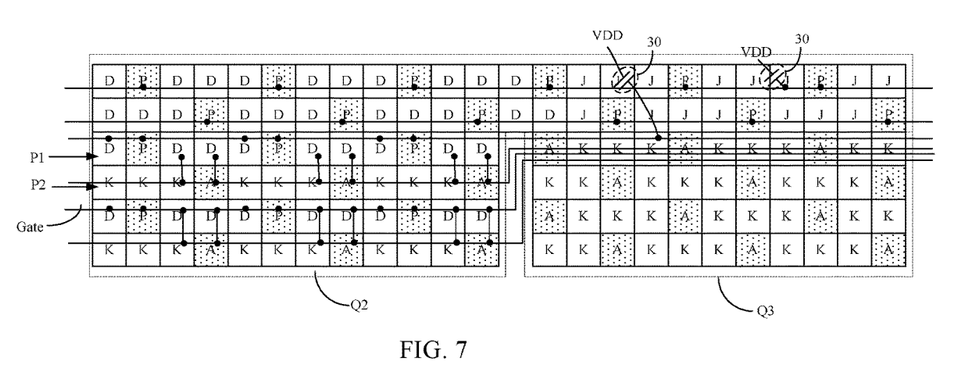
FIG. 7 is a schematic structural diagram of a transition area and an installation area of another display substrate according to an embodiment of the present disclosure.

In an example, as shown in FIG. 7, N=2, indicating that each group of light-emitting devices OLED in the installation area Q3 are located in two rows of sub-pixel areas; any two adjacent first pixel rows P1 are spaced apart by one second pixel row P2, and three second type sub-pixel areas D are disposed between two adjacent first type sub-pixel areas P of each first pixel row P1. That is, three driving sub-circuits 20 are disposed between two pixel circuits of the first pixel row P1. In this case, two of the three driving sub-circuits 20 are coupled to two light-emitting devices OLED in different rows in the installation area Q3.

Specifically, taking the example where the first first pixel row P1 in the transition area Q2 is coupled to the first group of light-emitting devices OLED (the first and second rows of light-emitting devices OLED) in the installation area Q3, for the driving sub-circuits 20 in the first and third second type sub-pixel areas D of the three second type sub-pixel areas D located between the two first type sub-pixel areas P in the first pixel row P1, one is coupled to a light-emitting device OLED in the first row of the installation area Q3, and the other is coupled to a light-emitting device OLED in the second row of the installation area Q3.

As shown in FIG. 7, in the second pixel row P2 adjacent to the first pixel row P1, the sub-pixel area at the same column as the second second type sub-pixel area D disposed between any two adjacent first type sub-pixel areas P is a third type sub-pixel area A, in which a light-emitting device OLED is disposed, and the remaining sub-pixel areas in the second pixel row P2 are the fourth type sub-pixel areas K. The driving sub-circuit 20 in the second second type sub-pixel area D of the three second type sub-pixel areas D located between the two first type sub-pixel areas P in the first pixel row P1 is coupled to the light-emitting devices OLED in the second pixel row P2 adjacent to the first pixel row P1.

It should be noted that the above takes two rows of light-emitting devices OLED in the installation area Q3 as a group, and one group of light-emitting devices OLED are controlled by the driving sub-circuits 20 in one first pixel row P1. In practical applications, the size of the installation area Q3 may be determined according to the size and number of the cameras, and the corresponding number of driving sub-circuits 20 may be disposed in each first pixel row P1 to drive the light-emitting devices OLED in the installation area Q3, and then the number of rows of light-emitting devices OLED in the installation area Q3 driven by the driving sub-circuits 20 in each first pixel row P1 may be determined according to the required wiring space of the signal connection lines 1.

In some embodiments, the light-emitting devices OLED in the installation area Q3 are classified into multiple groups, each group including M rows of light-emitting devices OLED arranged adjacently, where M≥4; and the driving sub-circuits 20 coupled to the light-emitting devices OLED of the same group are located in two first pixel rows P1; and two first pixel rows P1 for connecting the light-emitting devices OLED of the same group in the installation area Q3 are spaced apart by M−1 second pixel rows P2.

Figure 8:
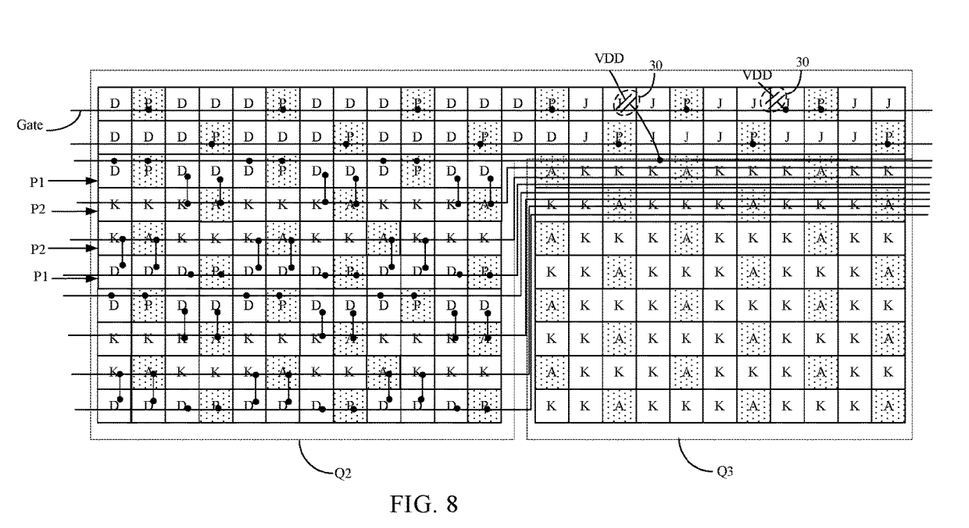
FIG. 8 is a schematic structural diagram of a transition area and an installation area of another display substrate according to an embodiment of the present disclosure.

In an example, as shown in FIG. 8, M=4, and the driving sub-circuits 20 in the second type sub-pixel areas D of each first pixel row P1 are coupled to two rows of light-emitting devices OLED in the installation area Q3; and the light-emitting devices OLED 20 coupled to the driving sub-circuits 20 in the second type sub-pixel areas D of different first pixel rows P1 are located in different rows. Three second type sub-pixel areas D are disposed between two adjacent first type sub-pixel areas P of the first pixel row P1. That is, three driving sub-circuits 20 are disposed between two pixel circuits of the first pixel row P1. In this case, two of the three driving sub-circuits 20 are coupled to two light-emitting devices OLED in different rows in the installation area Q3.

Specifically, taking the example where the first and second first pixel rows P1 in the transition area Q2 are coupled to the first group of light-emitting devices OLED (the first, second, third and fourth rows of light-emitting devices OLED) in the installation area Q3, two second pixel rows P2 are provided between the first and second first pixel rows P1, and for the driving sub-circuits 20 in the first and third second type sub-pixel areas D of the three second type sub-pixel areas D located between the two first type sub-pixel areas P in the first first pixel row P1, one is coupled to a light-emitting device OLED in the first row of the installation area Q3, and the other is coupled to a light-emitting device OLED in the second row of the installation area Q3. For the driving sub-circuits 20 in the first and third second type sub-pixel areas D of the three second type sub-pixel areas D located between the two first type sub-pixel areas P in the second first pixel row P1, one is coupled to a light-emitting device OLED in the third row of the installation area Q3, and the other is coupled to a light-emitting device OLED in the fourth row of the installation area Q3.

As shown in FIG. 8, in the first second pixel row P2 adjacent to the first first pixel row P1, the sub-pixel area at the same column as the second second type sub-pixel area D disposed between any two adjacent first type sub-pixel areas P is a third type sub-pixel area A, in which a light-emitting device OLED is disposed, and the remaining sub-pixel areas in the first second pixel row P2 are the fourth type sub-pixel areas K. The driving sub-circuit 20 in the second second type sub-pixel area D of the three second type sub-pixel areas D located between the two first type sub-pixel areas P in the first pixel row P1 is coupled to the light-emitting devices OLED in the first second pixel row P2. In the second second pixel row P2 adjacent to the second first pixel row P1, the sub-pixel area at the same column as the second second type sub-pixel area D disposed between two adjacent first type sub-pixel areas P in the second first pixel row P1 is a third type sub-pixel area A, in which a light-emitting device OLED is disposed, and the remaining sub-pixel areas in the second second pixel row P2 are the fourth type sub-pixel areas K. The driving sub-circuit 20 in the second second type sub-pixel area D of the three second type sub-pixel areas D located between the two first type sub-pixel areas P in the first pixel row P1 is coupled to the light-emitting devices OLED in the second pixel row P2 adjacent to the first pixel row P1.

It should be noted that the above takes four rows of light-emitting devices OLED in the installation area Q3 as a group, and one group of light-emitting devices OLED are controlled by the driving sub-circuits 20 in two first pixel rows P1. In practical applications, the size of the installation area Q3 may be determined according to the size and number of the cameras, and the corresponding number of driving sub-circuits 20 may be disposed in each first pixel row P1 to drive the light-emitting devices OLED in the installation area Q3, and then the number of rows of light-emitting devices OLED in the installation area Q3 driven by the driving sub-circuits 20 in each first pixel row P1 may be determined according to the required wiring space of the signal connection lines 1.

In some embodiments, a plurality of gate lines Gate are further disposed on the display substrate, and the driving sub-circuits 20 coupled to the light-emitting devices OLED of the same row are coupled to the same gate line Gate. Since a camera is to be provided in the installation area Q3 and the gate line Gate is made of a light-shielding material, the gate line Gate needs to be wound around a peripheral area of the installation area Q3, and meanwhile, the installation area Q3 has no driving sub-circuit 20, so as to prevent the gate line Gate from penetrating the installation area Q3, and the provided driving sub-circuit 20 from shielding the camera.

It will be appreciated that each sub-pixel area of the display area Q1 is provided with a pixel circuit. That is, each sub-pixel area in the display area Q1 is a first type sub-pixel area P. The driving sub-circuits 20 of each row of pixel circuits in the display area Q1 are coupled to the same gate line Gate, and a storage capacitor (that is, the storage capacitor C1 in FIG. 2) is disposed in each driving sub-circuit 20.

Since the driving sub-circuits 20 in the second type sub-pixel areas D of each first pixel row P1 are respectively coupled to the light-emitting devices OLED in the installation area Q3 and the light-emitting devices OLED in the second pixel row P2, the number of storage capacitors coupled to the gate lines coupled to to the driving sub-circuits 20 in the first pixel row P1 is smaller than the number of storage capacitors coupled to each gate line Gate in the display area Q1. Therefore, as shown in FIGS. 7 and 8, the transition area Q2 in the embodiment of the present disclosure is further provided with fifth type sub-pixel areas in which compensation capacitors 30 are formed. The gate lines Gate coupled to the driving sub-circuits 20 coupled to the light-emitting devices OLED in the installation area Q3 are coupled to first electrode plates of the compensation capacitors 30, and the gate lines Gate coupled to the driving sub-circuits 20 coupled to light-emitting devices OLED of different rows in the installation area Q3 are coupled to different compensation capacitors 30.

In some embodiments, the gate lines Gate coupled to the driving sub-circuits 20 in the sub-pixel areas of the same row as the fifth type sub-pixel areas J are also coupled to the compensation capacitors 30, and different gate lines Gate are coupled to different compensation capacitors 30.

Specifically, in the related art, in the transition area Q2 above the installation area Q3, each row of sub-pixel areas include first type sub-pixel areas P and second type sub-pixel areas D; each first type sub-pixel area P is provided with a pixel circuit; and each second type sub-pixel area D is provided with a driving sub-circuit 20. As shown in FIGS. 7 and 8, in an embodiment of the present disclosure, some of the second type sub-pixel areas D above the installation area Q3 may be replaced with fifth type sub-pixel areas J, in which compensation capacitors 30 are formed, and first electrode plates of the compensation capacitors 30 are coupled to the gate lines Gate coupled to the driving sub-circuits 20 coupled to the light-emitting devices OLED in the installation area Q3. Meanwhile, since some of the sub-pixel areas in the transition area Q2 are the fifth type sub-pixel areas J, the number of storage capacitors coupled to the gate lines Gate corresponding to a row of sub-pixel areas in which a fifth type sub-pixel area J is provided is smaller than the number of storage capacitors coupled to the gate lines Gate in the display area Q1. Therefore, a plurality of fifth type sub-pixel areas J are provided in the row of sub-pixel areas in which a fifth type sub-pixel area J is provided so that the gate lines Gate corresponding to the row of sub-pixel areas where a fifth type sub-pixel area J is provided can be coupled to the compensation capacitors 30 in the fifth type sub-pixel areas J of the row, thereby avoiding the problem of a dark display screen.

In some embodiments, the first electrode plates of the compensation capacitors 30 are coupled to the gate lines Gate, and disposed on the same layer and made of the same material as the gate lines Gate, and the second electrode plates of the compensation capacitors 30 are coupled to first power lines VDD, and are disposed on the same layer and made of the same material as the first power lines VDD. In this manner, neither the process steps nor the thickness of the display substrate is increased.

In a second aspect, an embodiment of the present disclosure further provides a display apparatus, including the display substrate as described above. The display apparatus may be, for example, an electronic device having a display panel, such as a mobile phone, a tablet, an electronic watch, a sports wristband, or a laptop. The technical effects of the display apparatus may refer to the above discussion of the technical effects of the display substrate, and thus are not repeated here.

It will be appreciated that the above implementations are merely exemplary implementations for the purpose of illustrating the principle of the disclosure, and the disclosure is not limited thereto. Various modifications and improvements can be made by a person having ordinary skill in the art without departing from the spirit and essence of the present disclosure. Accordingly, all of the modifications and improvements also fall into the protection scope of the present disclosure.

What is claimed is:

1. A display substrate, comprising a base having an installation area, a transition area surrounding the installation area, and a display area surrounding the transition area; the installation area, the transition area, and the display area each comprising a sub-pixel area; wherein the sub-pixel area in the transition area comprises at least a first type sub-pixel area and a second type sub-pixel area; and the sub-pixel area in the installation area comprises at least a third type sub-pixel area;

the first type sub-pixel area is provided with a pixel circuit on the base; the pixel circuit comprising a driving sub-circuit and a light-emitting device; the second type sub-pixel area is provided with the driving sub-circuit on the base; and the third type sub-pixel area is provided with the light-emitting device on the base; and wherein the light-emitting device in the third type sub-pixel area of the installation area is coupled to the driving sub-circuit in the second type sub-pixel area of the transition area via a signal connection line; different light-emitting devices are coupled to different signal connection lines and different driving sub-circuits; and orthographic projections of at least some of the signal connection lines overlap with one another on the base.

2. The display substrate according to claim 1, wherein the signal connection line comprises a first sub-connection line and a second sub-connection line electrically coupled to each other; the first sub-connection line is in the transition area, the second sub-connection line is in the installation area, and at least some first sub-connection lines are located on different layers, and have orthographic projections overlapped on the base.

3. The display substrate according to claim 2, wherein the first sub-connection line of each signal connection line is coupled to the second sub-connection line of the same signal connection line through a via penetrating an interlayer insulation layer.

4. The display substrate according to claim 2, wherein the driving sub-circuit comprises at least a thin film transistor; one part of the first sub-connection line is arranged on the same layer and made of the same material as a source electrode and a drain electrode of the thin film transistor, and the other part of the first sub-connection line is arranged on the same layer and made of the same material as the gate electrode of the thin film transistor.

5. The display substrate according to claim 2, wherein the second sub-connection line is arranged on a same layer and made of a same material.

6. The display substrate according to claim 1, wherein the sub-pixel area in the transition area further comprises a fourth type sub-pixel area; and the fourth type sub-pixel area is a vacant pixel area;
the sub-pixel areas are arranged in an array, and multiple rows of sub-pixel areas in the transition area comprise a first pixel row and a second pixel row; the first pixel row is a row of sub-pixel areas having the driving sub-circuits coupled to the light-emitting devices in the installation area; and the second pixel row is a row of sub-pixel areas having at least the fourth type sub-pixel area without the first or second type sub-pixel area; and
every N adjacent rows of light-emitting devices in the installation area form a group, where N≥2; and the driving sub-circuits coupled to the light-emitting devices of a same group are located in a same first pixel row; and any two adjacent first pixel rows are spaced apart by N-1 second pixel rows.

7. The display substrate according to claim 6, wherein N=2, three second type sub-pixel areas are between two adjacent first type sub-pixel areas of the first pixel row, and two of the driving sub-circuits in the three second type sub-pixel areas are respectively coupled to two light-emitting devices in different rows in the installation area.

8. The display substrate according to claim 6, wherein the signal connection line extends to the installation area through the second pixel row in the transition area.

9. The display substrate according to claim 6, wherein the second pixel row further comprises the third type sub-pixel area; and
the light-emitting device in the third type sub-pixel area of the second pixel row is coupled to the driving sub-circuit in the second type sub-pixel area in the transition area, and each driving sub-circuit is coupled to one light-emitting device, and different driving sub-circuits are coupled to different light-emitting devices.

10. The display substrate according to claim 9, wherein the light-emitting device in the third type sub-pixel area of the second pixel row and the driving sub-circuit coupled thereto are located in the same column of sub-pixel areas, and the two sub-pixel areas are adjacently disposed.

11. The display substrate according to claim 1, wherein the sub-pixel area in the transition area further comprises a fourth type sub-pixel area; and the fourth type sub-pixel area is a vacant pixel area;
the sub-pixel areas are arranged in an array, and multiple rows of sub-pixel areas in the transition area comprise a first pixel row and a second pixel row; the first pixel row is a row of sub-pixel areas having the driving sub-circuits coupled to the light-emitting devices in the installation area; and the second pixel row is a row of sub-pixel areas having at least the fourth type sub-pixel area without the first or second type sub-pixel area; and
every M adjacent rows of light-emitting devices in the installation area form a group, where M≥4; and the driving sub-circuits coupled to the light-emitting devices of a same group are located in two first pixel rows; and two first pixel rows for coupling the light-emitting devices of the same group in the installation area are spaced apart by M-1 second pixel rows.

12. The display substrate according to claim 11, wherein M=4, and the driving sub-circuits in the second type sub-pixel areas of the first pixel row are coupled to two rows of light-emitting devices in the installation area; and the light-emitting devices coupled to the driving sub-circuits in the second type sub-pixel areas of different first pixel rows are located in different rows; and
three second type sub-pixel areas are between two adjacent first type sub-pixel areas of the first pixel row, and two of the driving sub-circuits in the three second type sub-pixel areas are respectively coupled to two light-emitting devices in different rows in the installation area.

13. The display substrate according to claim 1, wherein the display substrate further comprises a plurality of gate lines on the base, the driving sub-circuits coupled to the light-emitting devices of a same row are coupled to a same gate line; and
the gate line coupled to the driving sub-circuits coupled to the light-emitting devices in the installation area penetrates the transition area and surrounds a peripheral area of the installation area, and a spacing of the gate lines in the transition area is greater than a spacing of the gate lines in the peripheral area of the installation area.

14. The display substrate according to claim 13, wherein the transition area further comprises fifth type sub-pixel areas in which compensation capacitors are provided, and the gate lines coupled to the driving sub-circuits coupled to the light-emitting devices in the installation area are coupled to the compensation capacitors in one-to-one correspondence.

15. The display substrate according to claim 14, wherein the gate lines coupled to the driving sub-circuits in a row of the pixel areas comprising the fifth type sub-pixel areas are coupled to the compensation capacitors, and different gate lines are coupled to different compensation capacitors.

16. The display substrate according to claim 14, wherein the display substrate further comprises a first power line on the base and coupled to the driving sub-circuit; and
a first electrode plate of the compensation capacitor is arranged on the same layer and made of the same material as the gate line, and a second electrode plate of the compensation capacitor is arranged on the same layer and made of the same material as the first power line.

17. The display substrate according to claim 1, wherein the light-emitting devices in the transition area and in the installation area are arranged in a same manner.

18. A display apparatus, comprising a display substrate according to claim 1.

* * * * *